United States Patent [19]

Umeki

[11] Patent Number: 4,771,190
[45] Date of Patent: Sep. 13, 1988

[54] EMITTER COUPLED LOGIC CIRCUIT PROVIDED WITH PULL-DOWN RESISTORS AT RESPECTIVE BASES OF INPUT TRANSISTORS

[75] Inventor: Yoshitaka Umeki, Tokyo, Japan

[73] Assignee: NEC Corporation, Tokyo, Japan

[21] Appl. No.: 934,580

[22] Filed: Nov. 24, 1986

[30] Foreign Application Priority Data
Nov. 22, 1985 [JP] Japan ............................. 60-264322

[51] Int. Cl.⁴ .................. H03K 19/086; H03K 19/20; H01L 17/16; H02H 9/00
[52] U.S. Cl. .................................. 307/455; 307/443; 307/445; 307/200 A; 361/58
[58] Field of Search ............. 361/58; 307/200 A, 443, 307/445, 455

[56] References Cited

PUBLICATIONS

"Low-Power Current Mode Logic", Verbeck.
"The Semiconductor Data Library", Series A, vol. IV, Motorola Inc. (1974), pp. 1-8.
"ELC Data Book", Fairchild Camera and Instrument Corp. (1977), pp. 3-4.

*Primary Examiner*—Stanley D. Miller
*Assistant Examiner*—M. R. Wambach
*Attorney, Agent, or Firm*—Sughrue, Mion, Zinn, Macpeak & Seas

[57] ABSTRACT

An ECL circuit includes a plurality of input terminals, a current source, a reference transistor having an emitter connected to the current source, a base receiving a reference voltage and a collector connected to a first resistor, a plurality of input transistors each having an emitter connected to the current source, a collector connected to a second resistor and a base connected to one of the input terminals, a plurality of pull-down resistors each connected between the base and the emitter of one of the input transistors, an emitter follower transistor having a base connected to the collector of the reference transistor or a common connection point of collectors of the input transistors and an emitter connected to an output terminal and a third resistor.

9 Claims, 2 Drawing Sheets

EMITTER COUPLED LOGIC CIRCUIT PROVIDED WITH PULL-DOWN RESISTORS AT RESPECTIVE BASES OF INPUT TRANSISTORS

BACKGROUND OF THE INVENTION

1. Field of the Invention

This invention relates to an emitter coupled logic (ECL) circuit having one or more input transistors and pull-down resistors, and more particularly to an improvement of the connection of the pull-down resistors.

2. Description of the Related Art

ECL circuits are widely used in logic circuits operable at a high speed. The ECL circuits are basically composed of a differential type comparator and one or two emitter-followers. The differential type comparator has a reference transistor applied with a reference voltage at its base, at least one input transistor receiving input signals at respective bases, and a constant current source supplying a constant current to emitters of the reference and input transistors. The input signals are compared with the reference voltage.

Usually, the input signals in an ECL circuit have a high level ($V_H$) between $-0.88$ and $-1.025$ volts and a low level ($V_L$) between $-1.62$ and $-1.81$ volts. The reference voltage is $-1.3$ volts. Transistors operating in this voltage range do not reach a saturated condition and do not store any storage carrier. The emitter-follower transistor(s) is also driven in a non-saturation condition. Therefore, the ECL circuit operates at a high speed, compared to any other type of logic circuit.

ECL gates in an ECL-IC have many input transistors. However, when the ECL circuits are used as input stages in logic IC's all of the input transistors are not always used. That is, the logic IC's are designed so as to be applicable to various usage. Accordingly, the number of input transistors in the input stage ECL circuit is not selected to fit the specific usage. For example, the logic IC having an input stage of three-input ELC OR/NOR gate may be used to receive two or three input signals. If two input signals are applied to the logic IC, one input of three-input ECL OR/NOR gate must leave open. Additionally, such input open condition occurs, when a wiring to the input terminal of the logic IC is accidentally disconnected.

ECL gates in the prior art are provided with pull-down resistors to drive the non-used transistors into a cut-off condition. The pull-down resistors are respectively inserted between a base of each input transistor and a power supply terminal held at a lower potential voltage. Due to the pull-down resistor, the input transistor having a base which is not connected to any outside circuit remains in a cut-off condition. The logic operation is determined by input transistors whose bases are connected to an outside circuit. The above-explained pull-down resistors are disclosed on page 1–8 of "THE SEMICONDUCTOR DATA LIBRARY" series A, volume IV, distributed by Motorola Inc., in 1974 and page 3–4 of "ECL DATA BOOK" distributed by Fairchild Camera and Instrument Corporation in 1977.

Heretofore, logic IC was composed of relatively large-sized transistors which have a relatively deep base-emitter junction and a relatively large breakdown voltage for the base-emitter junction. The conventional ECL gates have pull-down resistors and perform their functions without any trouble. In recent years, however, the integration density of transistors in the logic IC is greatly increased. The transistors used therein necessarily become smaller in size. The base-emitter junctions are designed with a shallow depth. Due to such miniaturization, the breakdown voltage of the base-emitter junction becomes low.

The base of an input transistor having no connection to an outside circuit is reduced to the lower potential of the power supply by the pull-down resistor. The emitter thereof is held at a potential lower than the reference voltage of $-1.3$ volts by a base-emitter forward voltage of 0.8 volts. The lower potential of the power supply in ECL logic is about $-5.0$ volts. The base-emitter junction of the input transistor is backward biased with $-2.9$ volts. Transistors having a shallow base-emitter junction fail under these conditions. As the base-emitter junction becomes shallower, the break-down of the base-emitter junction becomes an important problem to be solved.

SUMMARY OF THE INVENTION

The object of the present invention is to provide an improved ECL gate composed of transistors having a low base-emitter breakdown voltage.

Another object of the present invention is to provide an ECL gate suitable to be formed in an integrated circuit having a large integration density.

A further object of the present invention is to provide an ECL gate having an improved connection of pull-down resistors.

A logic circuit according to the present invention comprising a first and a second power terminal, a current source supplying a constant current and having one end connected to the first power terminal, a reference transistor having an emitter supplied with the constant current from the current source, a base receiving a reference voltage and a collector, at least one input transistor having an emitter supplied with the constant current from the current source, a base connected to an input terminal and a collector, a first load connected between the second power terminal and the collector of the reference transistor, a second load connected between the second power terminal and the collector of the input transistor, at least one pull-down resistor each connected between the base and the emitter of the input transistor, and a means for deriving an output from one of the collectors of the input and reference transistors.

In accordance with the present invention, the pull-down resistor or resistors are connected between the base and the emitter of the input transistor or transistors. When no signal is applied to an input terminal, the base of the transistor connected to the opened input terminal is lowered to the potential at the emitter by the pull-down resistor. The base is not lowered below its emitter voltage, because the pull-down resistor is connected between the base and emitter. This means that, if the input transistor is driven into a cut-off condition, the base-emitter junction is not backward biased. Therefore, the ECL logic according to the present invention may be formed by transistors having a base-emitter junction with a low breakdown voltage. In other words, the ECL logic according to the present invention may be formed in an integrated circuit having large-scale integration.

BRIEF DESCRIPTION OF THE DRAWINGS

The above and further objects, features and advantages of the present invention will become more apparent from the following detailed description taken in conjunction with the accompanying drawings, wherein.

Figure 1:
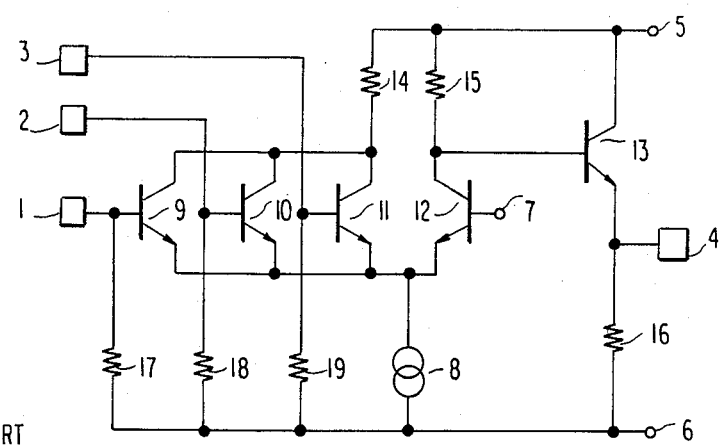
FIG. 1 is a circuit diagram showing an ECL circuit in the prior art.

An ECL circuit in the prior art may be represented by the circuit shown in FIG. 1. A power terminal 5 is supplied with a voltage $V_{CC}$ which is generally a ground potential. Another power terminal 6 is supplied with a voltage $V_{EE}$ which is about −5.0 volts, and more specifically a voltage from −4.5 volts to −5.2 volts. All the circuit elements are formed on a semiconductor chip. Input terminals 1, 2 and 3 are respectively connected to bases of input transistors 9, 10 and 11. Emitters of the input transistors 9, 10 and 11 are commonly connected to a constant current source 8 together with an emitter of a reference transistor 12. Collectors of the input transistors 9, 10 and 11 are commonly connected to a load resistor 14 which is in turn connected to the power terminal 5. Collector of the reference transistor 12 is connected to another load resistor 15 which is in turn connected to the power terminal 5. A reference voltage of −1.3 volts is applied to a base of the reference transistor 12 through a terminal 7. Pull-down resistors 17, 18 and 19 are respectively connected between the bases of the input transistors 9, 10 and 11 and the power terminal 6. A base of an emitter-follower transistor 13 is connected to the collector of the reference transistor 12. A collector of the emitter-follower transistor 13 is connected to the power terminal 5. A resistor 16 is connected between an emitter of the emitter-follower transistor 13 and the power terminal 6. The base of the emitter-follower transistor 13 may be connected to the connecting point of collectors of the input transistors 9, 10 and 11, instead of the collector of the reference transistor 12. An output terminal 4 is connected to the emitter of the emitter-follower transistor 13.

The ECL circuit shown in FIG. 1 represents a 3-input OR gate. The same ECL circuit may be used as a 2-input OR gate by applying input signals to two of the three input terminals 1, 2 and 3. The remaining one input terminal is held opened without being connected to an outside circuit. The input transistor having a base connected to the opened input terminal is driven into a cut-off condition by lowering the base potential to the potential at the power terminal 6 by the pull-down resistor. While the base potential is lowered, the emitter of the same transistor is maintained at a voltage lower than the reference voltage of −1.3 volts by a base-emitter forward voltage of 0.8 volts, that is, at a voltage of −2.1 volts. As a result, since the power terminal 6 is supplied with the voltage from −4.5 to −5.2 volts, the base-emitter junction of the input transistor driven into a cut-off condition is backward biased with 2.4 to 3.1 volts.

In the past, transistors in an integrated circuit were so large that the base-emitter junction may have a large breakdown voltage. The breakdown voltage of the base-emitter junction is determined by a difference in impurity density between emitter and base regions and an impurity profile in the emitter region. The impurity profile in the emitter region is not steep, if the emitter region has a sufficient depth. For example, the impurity density of the emitter region was abut $10^{20}$ cm$^{-3}$, that of the base region was about $10^{18}$ cm$^{-3}$, the depth of the emitter region is 0.6 μm and the breakdown voltage at the base-emitter junction was about 7 volts. Therefore, the circuit in the prior art had no problem if any input terminal 1, 2 or 3 is held opened.

In the recent years, however, the integration density of logic IC has been improved. The transistors held in a cut-off condition by opening the corresponding input terminal are often broken at the base-emitter junction. The cause for this destruction will be next considered.

The transistors used in the recent large-scale integrated circuits are greatly miniaturized by using a shallow emitter region, the depth being 0.08 μm, for example. The impurity density of the emitter region requires a value more than $10^{20}$ cm$^{-3}$, that of the base region in about—$10^{18}$ cm$^{-3}$—, similar to the conventional transistors. Accordingly, the impurity profile in the emitter region becomes steep, causing a low breakdown voltage of 3 volts at the base-emitter junction, which is nearly equal to the backward biased voltage at the base-emitter junction.

DESCRIPTION OF THE PREFERRED EMBODIMENTS

Figure 2:
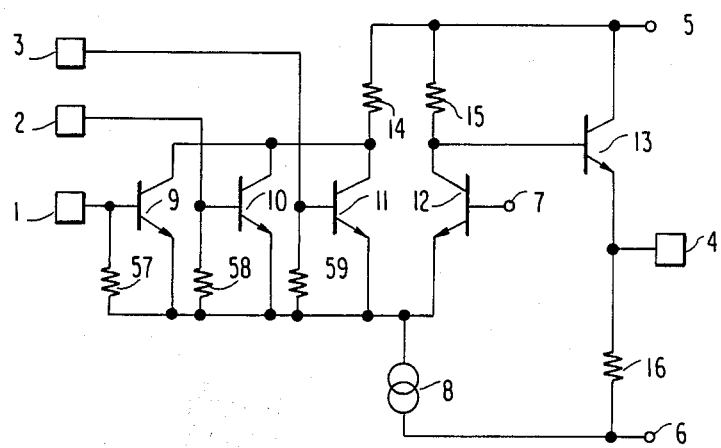
FIG. 2 is a circuit diagram showing an ECL circuit according to a preferred embodiment of the present invention.

The ECL circuit according to the first preferred embodiment shown in FIG. 2 has a similar circuit to the conventional circuit shown in FIG. 1, except for pull-down resistors 57, 58 and 59. The pull-down resistors 57, 58 and 59 have a resistance between 50 kiloohms and 10 kiloohms, preferably about 20 kiloohms, and are respectively connected between the base and emitter of the input transistors 9, 10 and 11. If the pull-down resistors 57, 58 and 59 have a resistance larger than 50 kiloohsm, the base voltage of the transistor held in a cut-off condition is easily affected by external noise, causing a malfunction. On the contrary, if the pull-down resistors have a resistance smaller than the 10 kiloohms, the voltage level of input signal changes to alter the output level. The resistance of the pull-down resistors 57, 58 and 59 are so selected from the range between 50 and 10 kiloohms that the voltage drop across the resistor 15 becomes nearly 600 milivolts. This value is controlled with the resistance value of the load resistors 14 and 15. One example of the resistance of the load resistors 14 and 15 is 900 ohms. The constant current supplied from the current source 8 may be 0.7 mA. The resistance of the resistor 16 may be 7.4 kiloohms.

When the ECL circuit shown in FIG. 2 is used as a two-input OR gate, one of the input terminals 1, 2 and 3 is held open. For example, the input signals are applied to the input terminals 2 and 3, the input terminal 1 being kept unconnected. The base of the input transistor 9 is lowered by the pull-down resistor 57. However, since the pull-down resistor 57 is connected between the base and emitter of the input transistor 9, the voltage at the base does not fall below the voltage at its emitter. Accordingly, the base-emitter junction of the input transistor 9 is not backward biased but biased to drive the input transistor 9 into a cut-off condition.

Since the base-emitter junctions of the input transistors 9, 10 and 11 are not biased backward, the ECL circuit shown in FIG. 2 may be formed of transistors having a base-emitter junction of a small breakdown voltage. In other words, the ECL circuit may be formed of transistors having shallow emitter regions and may be formed in a large-scale integrated circuit in which very miniaturized transistors are used.

The breakdown of the base-emitter junction is also generated in the ECL circuit in the prior art, when the connection to the input terminal 1, 2 or 3 is disconnected while the power voltage is supplied to the ECL circuit. Against such loose-connection, the input transistors in the ECL circuit according to the present invention is protected from being broken down. Therefore, the present invention may be applied to a comparator having one input transistor.

Figure 3:
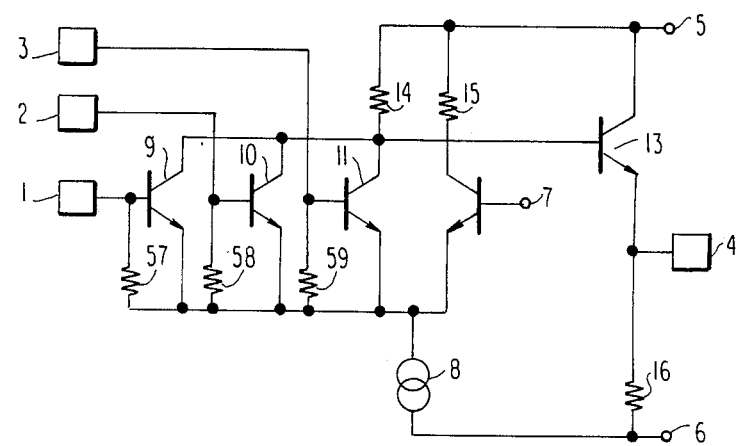
FIG. 3 is a circuit diagram showing an ECL circuit according to another preferred embodiment of the present invention.

The base of the emitter-follower transistor may be connected to a connection point of collectors of the input transistors 9, 10 and 11, as shown in FIG. 3 which illustrates a second preferred embodiment in accordance with the present invention. By this connection, the ECL circuit operates as a NOR gate. The same features and advantages as the OR gate can be obtained.

What is claimed is:

1. A logic circuit formed on a semiconductor substrate comprising:
    a first and a second power terminal, a power voltage being supplied between said first and second power terminals;
    a current source supplying a substantially constant current and having one end connected to said second power terminal;
    a reference transistor having an emitter supplied with said constant current from said current source, a base receiving a reference voltage and a collector;
    a plural number of input terminals;
    a plural number of input transistors each having an emitter supplied with said constant current from said current source, a base connected to one of said input terminals and a collector;
    a first load connected between said collector of said reference transistor and said first power terminal;
    a second load connected between said collectors of said input transistors and said first power terminal;
    a plural number of pull-down resistors each connected between said base and said emitter of said input transistors; and
    a means for deriving an output from one of said first load and said second load.

2. A logic circuit as claimed in claim 1, wherein said output deriving means comprises an emitter-follower transistor having a base connected to said collector of said reference transistor, a collector connected to said first power terminal and an emitter, an emitter resistor connected between said emitter of said emitter-follower transistor and said second power terminal, and an output terminal connected to said emitter of said emitter-follower transistor.

3. A logic circuit as claimed in claim 1, wherein said output deriving means comprises an emitter-follower transistor having a base connected to a connection point of said collectors of said input transistors, a collector connected to said first power terminal and an emitter, an emitter resistor connected between said emitter of said emitter-follower transistor and said second power terminal and an output terminal connected to said emitter of said emitter-follower transistor.

4. A logic circuit as claimed in claim 1, wherein said pull-down resistors have a resistance between 50 and 10 kiloohms.

5. A logic circuit as claimed in claim 4, wherein said first power terminal has a grounding potential, said second power terminal having a voltage between $-4.5$ and $-5.2$ volts, and said reference voltage being $-1.3$ volts.

6. A logic circuit formed on a semi-conductor substrate comprising:
    a power means for supplying a power voltage between a first power line and a second power line;
    a current source connected to said second power line and supplying a constant current;
    a reference transistor having an emitter connected to said current source, a base receiving a reference voltage and a collector;
    an input terminal;
    an input transistor having an emitter connected to said current source, a base connected to said input terminal and a collector;
    a pull-down resistor connected between said base and said emitter of said input transistor;
    a first resistor connected between said collector of said reference transistor and said first power line;
    a second resistor connected between said collector of said input transistor and said first power line; and
    a means for deriving an output from one of said collectors of said reference transistor and input transistor.

7. A logic circuit as claimed in claim 6, wherein said logic circuit further comprises at least one additional input terminal, at least one additional input transistor having an emitter connected to said current source, a base connected to said additional input terminal and a collector connected to said second resistor, and at least one pull-down resistor connected between said base and said emitter of said additional input transistor.

8. A logic circuit as claimed in claim 7, wherein said output deriving means comprises an output terminal, an emitter-follower transistor having a base connected to one of the collectors of said reference and input transistors, a collector connected to said first power line, and an emitter connected to said output terminal, and a resistive element connected between said emitter of said emitter-follower transistor and said second power line.

9. A logic circuit as claimed in claim 8, wherein said pull-down resistor and said additional pull-down resistor have a resistance between 50 and 10 kiloohms.

* * * * *